US012801824B2

(12) United States Patent
Lu et al.

(10) Patent No.: US 12,801,824 B2
(45) Date of Patent: Nov. 17, 2026

(54) METHOD FOR PARASITIC EXTRACTION BASED ON TARGET DETECTION NETWORK

(71) Applicant: Southeast University, Nanjing (CN)

(72) Inventors: Shengli Lu, Nanjing (CN); Mingyue Jiang, Nanjing (CN); Tianzhu Liang, Nanjing (CN)

(73) Assignee: Southeast University, Nanjing (CN)

( * ) Notice: Subject to any disclaimer, the term of this patent is extended or adjusted under 35 U.S.C. 154(b) by 760 days.

(21) Appl. No.: 18/257,098

(22) PCT Filed: Sep. 26, 2022

(86) PCT No.: PCT/CN2022/121419
§ 371 (c)(1),
(2) Date: Jun. 12, 2023

(87) PCT Pub. No.: WO2023/206954
PCT Pub. Date: Nov. 2, 2023

(65) Prior Publication Data

US 2025/0021738 A1 Jan. 16, 2025

(30) Foreign Application Priority Data

Apr. 27, 2022 (CN) ........................ 202210453278.9

(51) Int. Cl.
*G06F 30/398* (2020.01)
*G06F 30/27* (2020.01)

(52) U.S. Cl.
CPC ............ *G06F 30/398* (2020.01); *G06F 30/27* (2020.01)

(58) Field of Classification Search
CPC ........ G06F 30/398; G06F 30/27; G06F 30/32; G06N 3/045; G06N 3/08
See application file for complete search history.

(56) References Cited

U.S. PATENT DOCUMENTS 5,903,469 A 5/1999 Ho
11,314,916 B2 * 4/2022 Widiger ................ G06F 30/392
(Continued)

FOREIGN PATENT DOCUMENTS

CN 102364480 A 2/2012
CN 104298837 A 1/2015
(Continued)

OTHER PUBLICATIONS

Abouelyazid et al., Fast and Accurate Machine Learning Compact Models for Interconnect Parasitic Capacitances Considering Systematic Process Variations, IEEE Access, vol. 10, Jan. 20, 2022, pp. 7533-7553 (Year: 2022).*
(Continued)

*Primary Examiner* — Nghia M Doan
(74) *Attorney, Agent, or Firm* — MUNCY, GEISSLER, OLDS & LOWE, P.C.

(57) ABSTRACT

A method for parasitic extraction based on a target detection network. The method includes the following steps: establishing a parasitic capacitance pattern library; creating a dataset that conforms to layout interconnection features; training the target detection network by using a self-established dataset and optimizing the network by modifying loss functions; predicting layout images by a trained network, conducting a subsequent processing on predicted results of the network and obtaining values for parasitic parameters. This provides a simple and optional solution for establishing a parasitic parameters pattern library and conducting a pattern matching in the digital integrated circuit.

4 Claims, 4 Drawing Sheets

(56) References Cited

U.S. PATENT DOCUMENTS

| | | | | |
|---|---|---|---|---|
| 11,620,548 | B1 * | 4/2023 | Bhushan | G06N 20/00 706/12 |
| 11,797,744 | B1 * | 10/2023 | Chuang | G06F 30/27 |
| 2020/0184137 | A1 | 6/2020 | Tsutsui et al. | |

FOREIGN PATENT DOCUMENTS

| | | | |
|---|---|---|---|
| CN | 108959666 | A | 12/2018 |
| CN | 111797584 | A | 10/2020 |
| CN | 114357925 | A | 4/2022 |
| CN | 114781290 | A | 7/2022 |
| WO | WO-2022033052 | A1 | 2/2022 |

OTHER PUBLICATIONS

He et al., "A parasitic parameter extraction method for on-chip interconnects including the optical proximity effect," Journal of Zhejiang University of Technology, vol. 34 No. 5, Oct. 2006, 4 pages.

Chen et al., "Application of Neural Networks to Parasitic Capacitance Extraction of VLSI Interconnects," Journal of Basic Science and Engineering, vol. 16, No. 5, Oct. 2008, 7 pages.

* cited by examiner

| Layer relationship | R(HEX) | G(HEX) | B(HEX) | R | G | B | Layout color | Layer spacing (nm) | Dielectric constant $(10^{9}F/m)$ | Unit capacitance value $F/(nm^2)$ |
|---|---|---|---|---|---|---|---|---|---|---|
| M4 | 0 | 40 | 0 | 0 | 64 | 0 | | / | / | |
| M34 | 40 | 40 | 0 | 64 | 64 | 0 | | d34 | ε34 | ε34/d34 |
| M3 | 40 | 0 | 0 | 64 | 0 | 0 | | / | / | |
| M23 | 40 | 0 | BF | 64 | 0 | 191 | | d23 | ε23 | ε23/d23 |
| M2 | 0 | 0 | BF | 0 | 0 | 191 | | / | / | |
| M12 | 0 | BF | BF | 0 | 191 | 191 | | d12 | ε12 | ε12/d12 |
| M1 | 0 | BF | 0 | 0 | 191 | 0 | | / | / | |
| M01 | BF | BF | 0 | 191 | 191 | 0 | | d01 | ε01 | ε01/d01 |
| M0 | BF | 0 | 0 | 191 | 0 | 0 | | / | / | |

FIG. 2

METHOD FOR PARASITIC EXTRACTION BASED ON TARGET DETECTION NETWORK

TECHNICAL FIELD

The present disclosure relates to the technical field of parasitic extraction, and specifically relates to a method for extracting parasitic parameters based on a target detection network.

BACKGROUND

Parasitic extraction is a step at the backend of a design for digital integrated circuit, which extracts parasitic resistance and parasitic capacitance in interconnections from layouts that complete layouts and wirings. As process nodes advance, parasitic capacitance and parasitic resistance caused by interconnections will gradually increase their impacts on circuit timings. Meanwhile, with larger scales of integrated circuits, higher requirements are proposed for extraction abilities and extraction efficiencies of tools for extracting parasitic parameters. Usual extraction methods can be divided into a field solving method and a pattern matching method. A pattern library is established in advance by the pattern matching method according to geometric structures and geometric parameters. The actual layouts are compared with the pattern library when extracting the parasitic parameters to obtain values for resistance and capacitance. This method is more suitable for large-scale circuits, but errors often occur due to pattern matching errors, and establishments of the pattern library are time-consuming and laborious.

The application of artificial intelligence in industrialization has opened up a new path for extracting tools. The pattern library is established automatically by using clustering algorithms, which replaces a lengthy establishing process by hand. In addition, during the matching process, patterns are classified by applying neural networks, which is capable of improving efficiency and accuracy of the matching. However, previous studies views of the layouts have focused on a cross-sectional view, by dividing three-dimensional layout structures into two-dimensional parasitic parameters for a unit length and accumulating them. In fact, if each layer of the layouts is treated as an image, planar information can be directly extracted from one layer by applying methods for processing images.

SUMMARY

In view of the above disadvantages of the prior art, the present disclosure provides a method for extracting parasitic parameters based on a target detection network, which simplifies establishments of a pattern library, conducts classifications and positionings of geometric structures of interconnections in layouts through the target detection network, and compares results that output by the network with the pattern library to implement an accurate pattern matching. The present disclosure aims to provide a simple and optional solution for establishing a parasitic pattern library and conducting a pattern matching in the digital integrated circuit.

In order to achieve above-mentioned objectives, the following technical solutions are provided by the present disclosure. Provided is a method for extracting parasitic parameters based on a target detection network. The method generates an image set and labelled images that are similar to the layouts, creates a training set, optimizes loss functions, trains the target detection network and inputs other layout images into a trained network, and the network is capable of outputting patterns and coordinate information comparing a pattern library, positioning wires, and obtaining values for parasitic capacitance.

Specific steps includes the following.

In Step 1, a parasitic capacitance pattern library is established.

In Step 2, images that conform to layout interconnection features are generated and labelled to construct a dataset.

In Step 3, the target detection network is trained by using the dataset, and the target detection network is optimized by optimizing loss functions.

In Step 4, layout images are predicted by the trained target detection network, predicted results of the network are processed subsequently and values for parasitic parameters are obtained.

Preferably, specific steps of Step 1 are that: different colors are set to represent different metal layers or overlapping relationships of wires, a capacitance formula look-up table for surface capacitance related to geometric structures (including layer relationships and a spacing range for the wires in the same layer) and a capacitance formula look-up table for coupling capacitance related to geometric structures (the number of conductors in the same layer) are respectively listed.

Preferably, specific steps of Step 2 are that: different color blocks are set to represent different metal layers or overlapping relationships of the wires (the overlapping relationship of wires in different layers or the overlapping relationship of wires in the same layer), a plurality of vertical or horizontal color blocks with different colors or sizes are generated randomly as an interference background in the central region of an image. According to the proportion of overlapping parts to all wires existing on an actual layout, target color blocks representing the overlapping relationships of the wires are generated randomly on the interference background, and categories and coordinate values for the target color blocks are exported as labels.

Preferably, specific steps of optimizing the loss functions of the target detection network according to a specific application of an area prediction in Step 3 are that: an area loss is added to the loss functions of an original target detection network, namely, a target loss, a category loss and a prediction frame loss; a hyper-parameter evolution on coefficients before each loss is conducted after a pre-training to obtain optimal coefficients of each loss.

Preferably, Step 4 includes as follows. The multi-layer wire three-dimensional structures that described by the layout files are visualized as images according to three view drawings, a top view is used to extract the surface capacitance, a left view and a front view are used to extract the coupling capacitance. The layout images are divided into a plurality of smaller images according to pattern sizes, which are taken as inputs of the target detection network. The layout images are predicted by the target detection network, the geometric structures are obtained by predicted classification results, which are compared with the pattern library to obtain capacitance calculating formulas. The wires are positioned by central coordinates of a prediction frame, geometric parameters (including an overlapping area, a width of a overlapping part and a length of the overlapping part) are obtained by coordinates and sizes of the prediction frame, which are substituted into the formula for calculation to obtain values for parasitic capacitance of each wire.

Beneficial effects lie in the following.

1. The target detection network is adopted by the present disclosure during the pattern matching processing, this kind of network is a deep neural network used for detecting target, which is capable of classifying and positioning the targets in the images. By taking the overlapping structures of the wires as detected targets and the layout image containing only interconnects as the network input, the categories, namely, patterns, of the wires are obtained by the network and geometrical parameters such as position, overlapping area, overlapping width, overlapping length of the wires in the layout can be obtained according to the coordinates of the predicted frame. Since the target detection network has developed to yolo v5, which is capable of implementing a rapid and accurate target detection. Complex matching algorithms are replaced by using the network, which improves the matching accuracy.
2. The pattern library in the present disclosure conducts a pattern classification according to the geometric structures that affects the wires, provides calculating formulas of values for the parasitic surface capacitance and the parasitic coupling capacitance according to analytical method, and the sum of the two values is a value for parasitic capacitance. The specific geometric parameters (such as wire length, width) are only taken as variables in the formula, thus there is need to subdivide the patterns based on the geometric parameters, which can greatly reduce a scale of the pattern library and the pattern library established in this way is also applicable to various process dimensions. During the matching process, the parasitic capacitance can be calculated by substituting geometric parameters such as values for overlapping areas into capacitance analytical formulas of the corresponding patterns.
3. Different layers or overlapping relationships are distinguished by applying different colors in the present disclosure, and this method is in conjunction with graph neural networks to provide a simple and practical algorithm for identifying layer relationships.
4. The target detection network is introduced into the field of parasitic parameters extraction for the first time by the present disclosure and no labelled layout image set is available for training, therefore, dataset in the present disclosure is self-built according to the layout interconnection features in the present disclosure. The dataset only contains interconnects, and the required scale of the image sets can be automatically generated according to the interconnect features in actual layouts. This method effectively simplifies the dataset while simulating layout images, and saves a huge workload of manual annotations.

BRIEF DESCRIPTION OF THE DRAWINGS

FIG. 2 illustrates a simplified pattern library for a parasitic surface capacitance.

DETAILED DESCRIPTION OF THE EMBODIMENTS

The present disclosure is further described in combination with the accompanying drawings and the embodiments.

Figure 1:
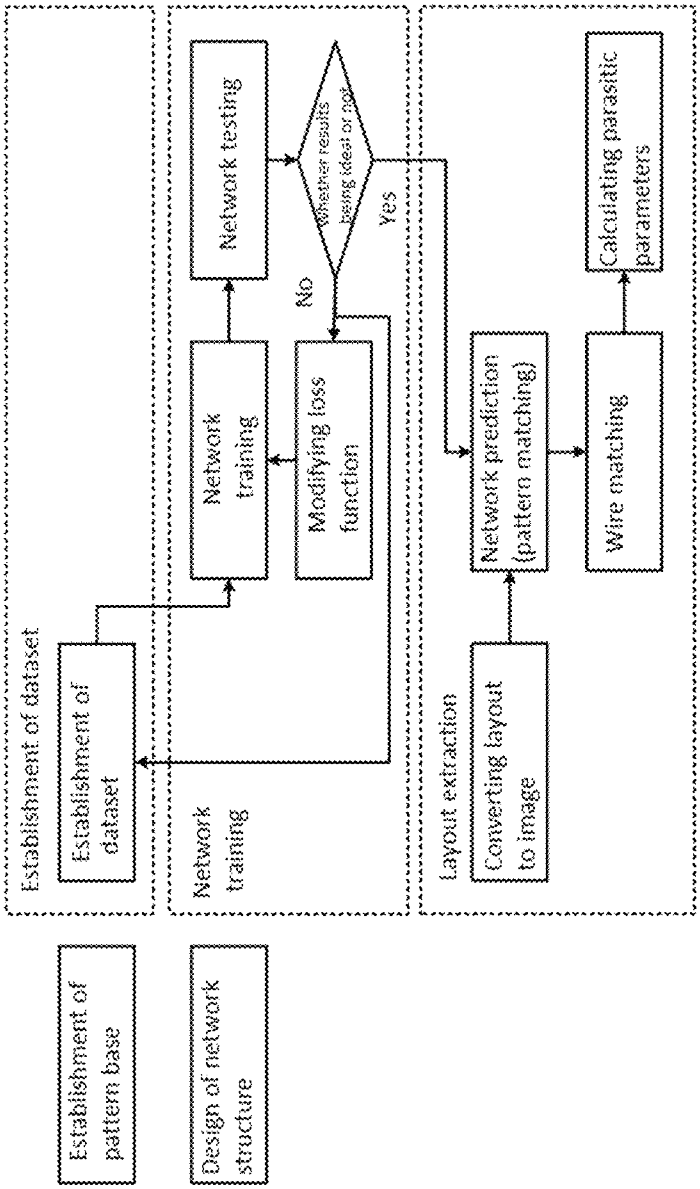
FIG. 1 illustrates a designed flow chart of a method for extracting a parasitic capacitance.
Figure 3A:
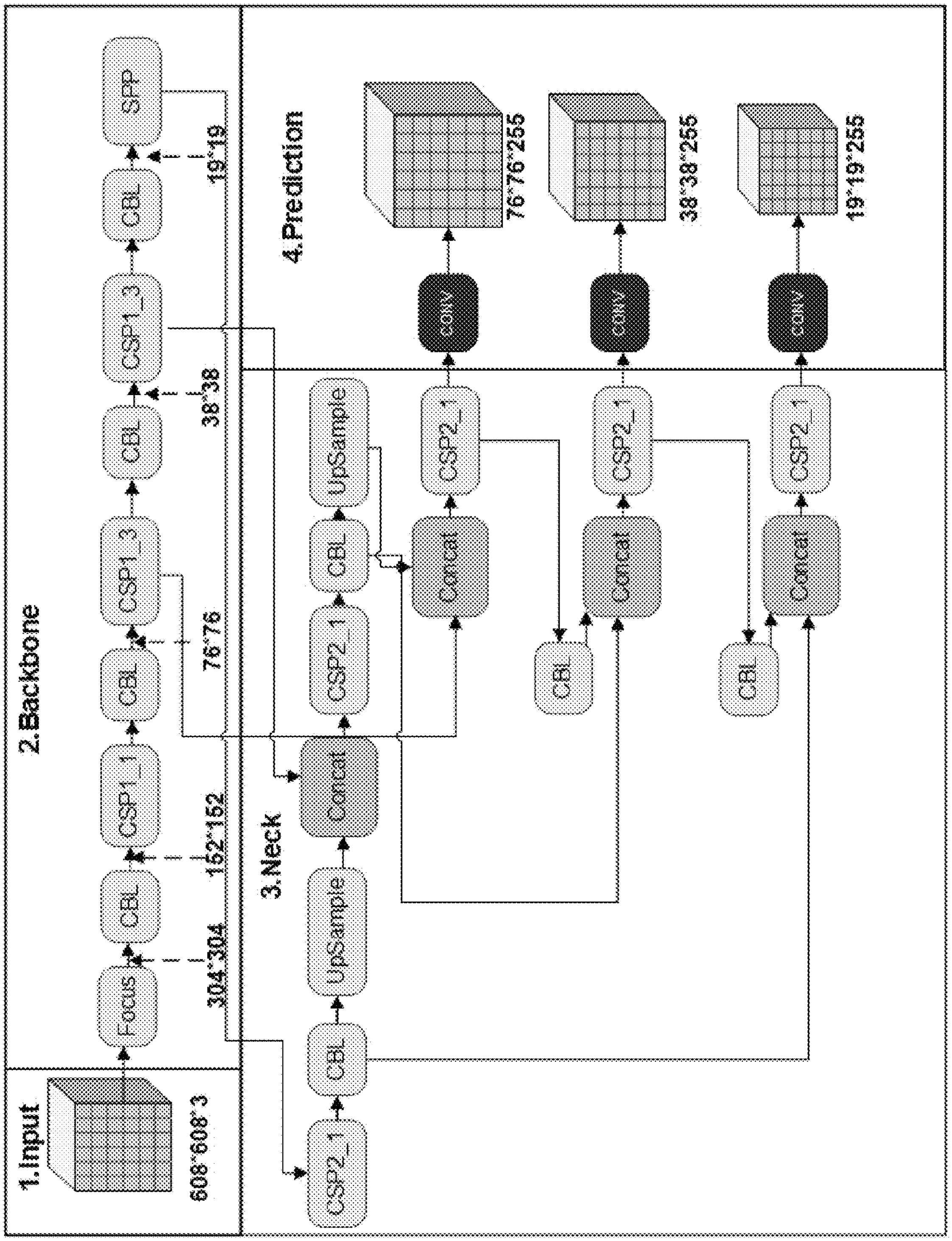
FIGS. 3(*a*) and 3(*b*) illustrate a structural design for a target detection network.
Figure 3B:
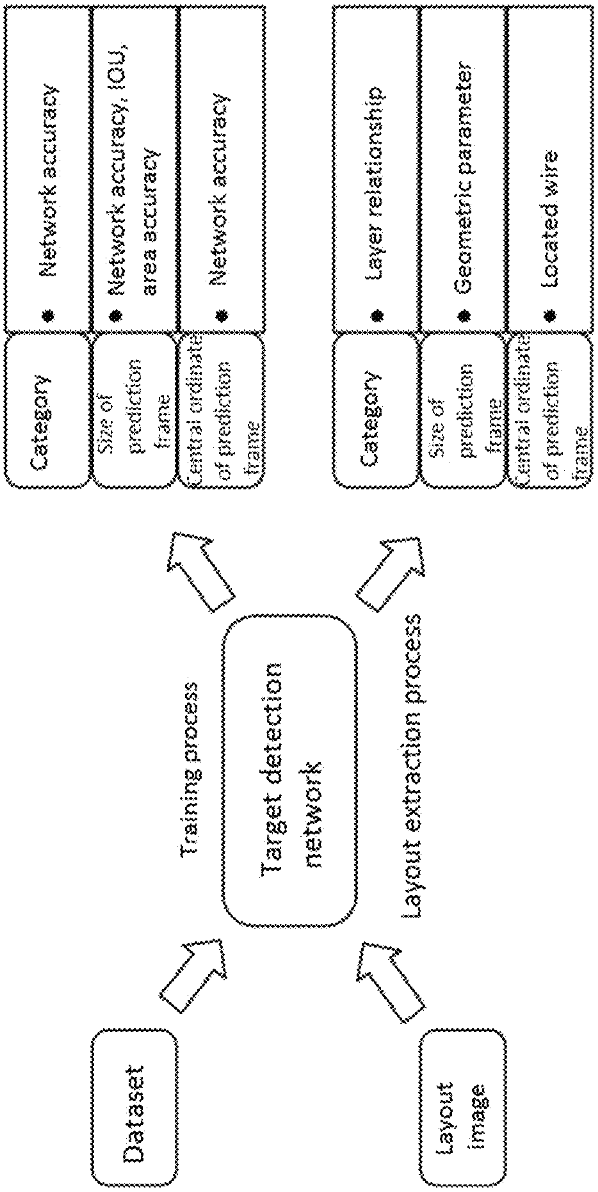

FIG. 1 illustrates a designed flow chart of a method for extracting a parasitic capacitance. Firstly, a pattern library (as illustrated in FIG. 2) and a network structure (as illustrated in FIG. 3(*a*) and FIG. 3(*b*)) are designed, and then an algorithm is designed. The whole algorithm frame includes three parts of dataset establishment, network training and layout extraction.

(1) Dataset Establishment

Firstly, a dataset used by the target detection network is established, which needs to conform to the features of layouts that only contains interconnects. Layouts that only contain interconnects are reflected as a plurality of color blocks of different colors and different lengths, and the proportion of target color blocks to the interfering color blocks, the length ranges and the width ranges of the color blocks, and the distribution regions of the color blocks in the images need to be consistent with the actual layouts.

(2) Network Training

Then, this dataset is used for the network training and the verification, when the test results are not ideal, the loss function is modified and the loss function after a modification is that:

$$\text{loss} = \lambda_{obj} l_{obj} + \lambda_{cls} l_{cls} + \lambda_{box} l_{box} + \lambda_{area} l_{area}, \tag{1}$$

where the front three items of the formula are the loss function of the original target detection network, namely, the weighted sum of the target loss, the category loss, and the prediction frame loss, and the last item is the added area loss. Or the data set is redesigned by changing the length range of the color blocks to optimize the training results until the network test results meet the expectations.

(3) Layout Prediction

The layout images are predicted by using the trained network, and the classification provided is the pattern in the pattern library. Therefore, the process of the network prediction is the process of conducting the pattern matching. After conducting the net matching on the predicted values, parameters such as the overlapping area, the width of the overlapping part, the length of the overlapping part are substituted into the calculating formulas that corresponding to the pattern for calculation, and the other required wire geometric parameters (including the wire spacing and the wire length) are read directly from the original layout files and eventually the parasitic values are obtained.

FIG. 2 illustrates a simplified pattern library for a parasitic surface capacitance, the pattern library described in this figure is only for illustration. Only one wire is considered in each layer, with a total of five layers of metal from M0 to M4, and the surface capacitance is simplified as a flat capacitor, the actual pattern library will be more complex. Different RGB values are set to distinguish different layers and overlapping relationships of the layers, and an expression for the unit capacitance value is written to obtain the pattern library, each kind of the layer overlapping relationships and its corresponding unit capacitance formula are a pattern. The layer spacing and dielectric constant values are input in advance, and then overlapping area and layer relationship of the network that output by the network are corresponding to the pattern library, and the capacitance values can be obtained by substituting it into the capacitance expression, which is the process for matching the pattern capacitance.

FIG. 3 illustrates a structural design for a target detection network. FIG. 3(*a*) illustrates the inner structure of the network, using the network model of YOLO v5s, which consists of four parts: input terminal (Input), backbone network (Backbone), neck network (Neck), and prediction terminal (Prediction). The original images are processed by the input terminal and then input into the network. The backbone network is composed of modules such as convolution, BN batach normalization, Leaky relu activation function, and conducts core calculations on the feature map. A cross layer structure is added into the neck network, which enhances the ability of the network feature fusion. The prediction terminal outputs predicted results of the network, including category information and prediction frame information.

FIG. 3(*b*) illustrates the outer structure of the network, that is the designs for the input and output of the network. The input and the output situations of the network are divided into a training process and an layout extraction process. The training process takes a dataset as an input, and the output categories, the sizes of the prediction frame, the central coordinates of the prediction frames are all used to calculate parameters that represent network accuracy, such as accuracy, recall, mean average precision (mAP). In addition, since the tasks that completed by the network has the predicted overlapping area, the sizes of the prediction frames are also used to calculate the area accuracy. The layout images are input during the layout extraction process, and the output categories represent layer relationships, that is, which two layers of metal overlap with each other. The sizes of the prediction frames represent the overlapping area, and the side length of the prediction frame represents the width and the length of the overlapping part. The central coordinates of the prediction frame is capable of locating the wires, that is, the located wires or the overlapping layer relationships of the located wires. It can be seen that the coordinates and sizes of the prediction frames determine a plurality of geometric parameters of wires, thereby the error of the prediction frames must be minimal.

The above embodiments are only to illustrate the technical concepts of the present disclosure and are not used to limit the protection scope of the present disclosure. Any modifications made on the basis of the disclosed technical solutions according to the technical concepts proposed in the present disclosure are all within the protection scope of the present disclosure.

What is claimed is:

1. A method for parasitic extraction based on a target detection network, comprising following steps:

Step 1, establishing a parasitic capacitance pattern library;

Step 2, generating images that conform to layout interconnection features and annotating based on the parasitic capacitance pattern library to construct a dataset;

Step 3, training, by using the dataset, the target detection network, and optimizing, by optimizing loss functions, the target detection network; and Step 4, predicting, by the trained target detection network, layout images, processing predicted results of the network subsequently, and obtaining values for parasitic parameters, wherein Step 2 includes:

setting different colors to represent color blocks in different wire layers;

randomly generating a plurality of vertical or horizontal color blocks with different colors or different sizes in an image as an interference background;

randomly generating target color blocks that represent different overlapping relationships on the interference background; and exporting pattern categories and coordinate values for the target color blocks as annotations, and wherein a number proportion of the target color blocks and interference color blocks is set approximate to a proportion value for an actual layout situation, a length range and a width range of the color blocks take reference to value ranges of a length and a width of the actual wires, a distribution of the color blocks in the image is concentrated in a central region, and a shape of the color blocks is rectangular.

2. The method for parasitic extraction based on the target detection network according to claim 1, steps of Step 1 are specifically: setting different colors to represent different wire layers, overlapping relationships of wires in different layers, or overlapping relationships of wires in a same layer, and listing a look-up table with geometric structures corresponding to capacitance formulas to construct the parasitic capacitance pattern library.

3. The method for parasitic extraction based on the target detection network according to claim 1, specific steps of optimizing the loss functions of the target detection network according to a specific application of an area prediction in Step 3 are: adding an area loss to the loss functions of an original target detection network, namely, a target loss, a category loss and a prediction frame loss; and conducting a hyper-parameter evolution on coefficients before each loss after a pre-training to obtain optimal coefficients of each loss.

4. The method for parasitic extraction based on the target detection network according to claim 1, Step 4 includes: visualizing layout files as images as inputs of the target detection network, and predicting, by the target detection network, layout images; comparing predicted classification results with the pattern library to obtain capacitance calculating formulas, positioning, from central coordinates of a prediction frame, the wires, obtaining, from coordinates and sizes of the prediction frame, an overlapping area, a width of an overlapping part and a length of the overlapping part, and substituting into the formulas to obtain values for parasitic capacitance of each wire.

* * * * *